(12) United States Patent
Tsironis

(10) Patent No.: US 10,971,791 B1
(45) Date of Patent: Apr. 6, 2021

(54) TRANSMISSION LINE FOR HIGH POWER TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 0 days.

(21) Appl. No.: 16/246,022

(22) Filed: Jan. 11, 2019

(51) Int. Cl.
  *H03H 7/38* (2006.01)
  *H01P 5/04* (2006.01)
  *H05K 1/02* (2006.01)
  *H01R 24/38* (2011.01)

(52) U.S. Cl.
  CPC .............. *H01P 5/04* (2013.01); *H01R 24/38* (2013.01); *H03H 7/38* (2013.01); *H05K 1/0237* (2013.01)

(58) Field of Classification Search
  CPC ... H03H 7/38; H03H 7/40; H01P 1/18; G01R 27/2694; G01B 25/02
  USPC .................................... 333/263, 32, 33, 17.3
  See application file for complete search history.

(56) References Cited

U.S. PATENT DOCUMENTS

| | | | | |
|---|---|---|---|---|
| 4,477,786 A * | 10/1984 | Tamura | ..................... | H01P 7/04 333/206 |
| 5,563,562 A * | 10/1996 | Szwec | .................... | H01R 24/44 174/152 GM |
| 5,994,975 A * | 11/1999 | Allen | ........................ | H01P 1/04 174/152 GM |
| 6,674,293 B1 | 1/2004 | Tsironis | | |
| 9,666,928 B1 * | 5/2017 | Tsironis | ..................... | H01P 5/04 |
| 2001/0022543 A1 * | 9/2001 | Ando | ..................... | H01P 1/2053 333/134 |
| 2007/0222539 A1 * | 9/2007 | Antkowiak | ............. | H01P 5/183 333/115 |
| 2009/0058566 A1 * | 3/2009 | Jones | ........................ | H01P 7/06 333/227 |

OTHER PUBLICATIONS

Load Pull [online], Wikipedia [retrieved on Nov. 18, 2016], Retrieved from Internet <URL:http://en-wikipedia.org/wiki/Load_pull>.
"Computer Controlled Microwave Tuner—CCMT", Product Note 41, Focus Microwaves, Jan. 1998.
Standing wave ratio, VSWR [online], Wikipedia [retrieved Mar. 2, 2017], Retrieved from Internet <URL:http://en.wikipedia.org/wiki/Standing_wave_ratio>.
Invar [online], Wikipedia [retrieved Jan. 11, 2019]. Retrieved from Internet <URL:http://en.wikipedia.org/wiki/Invar>.
Super INVAR 32-5 Technical Data [online], High Temp Metals [retrieved on Dec. 15, 2018], Retrieved from Internet URL:http://www.hightempmetals.com/techdata/hitempSuperInvardata.php>.

(Continued)

*Primary Examiner* — Stephen E. Jones

(57) ABSTRACT

Impedance tuners used in high power measurements suffer fast heating and consequently mostly linear thermal expansion of the central conductor, which has a very small mass and is thermally isolated from the slabline walls and the tuner housing. This leads to false measurements or catastrophic tuner failure (short) of either the DUT or the tuner. Gold plated INVAR and SUPER-INVAR center conductor material is preferred to traditional stainless-steel rod. The body of the airline is made of high conductivity low cost Aluminum. INVAR type alloys quasi eliminate the thermal expansion, reducing it by a factor between 10 and 40 compared to Steel. Practical tests have shown significant improvement in thermal behavior.

3 Claims, 11 Drawing Sheets

(56) References Cited

OTHER PUBLICATIONS

Electrical Conductivity of common Materials [online], The Engineering ToolBox [retrieved on Dec. 17, 2018], Retrieved from Internet <URL:https://www.engineeringtoolbox.com/conductors-d_1381.html>.

Scattering (s-) parameters [online], Wikipedia [retrieved on Dec. 18, 2018], Retrieved from Internet <URL: https://en.wikipedia.org/wiki/Scattering_parameters#Definition>.

* cited by examiner

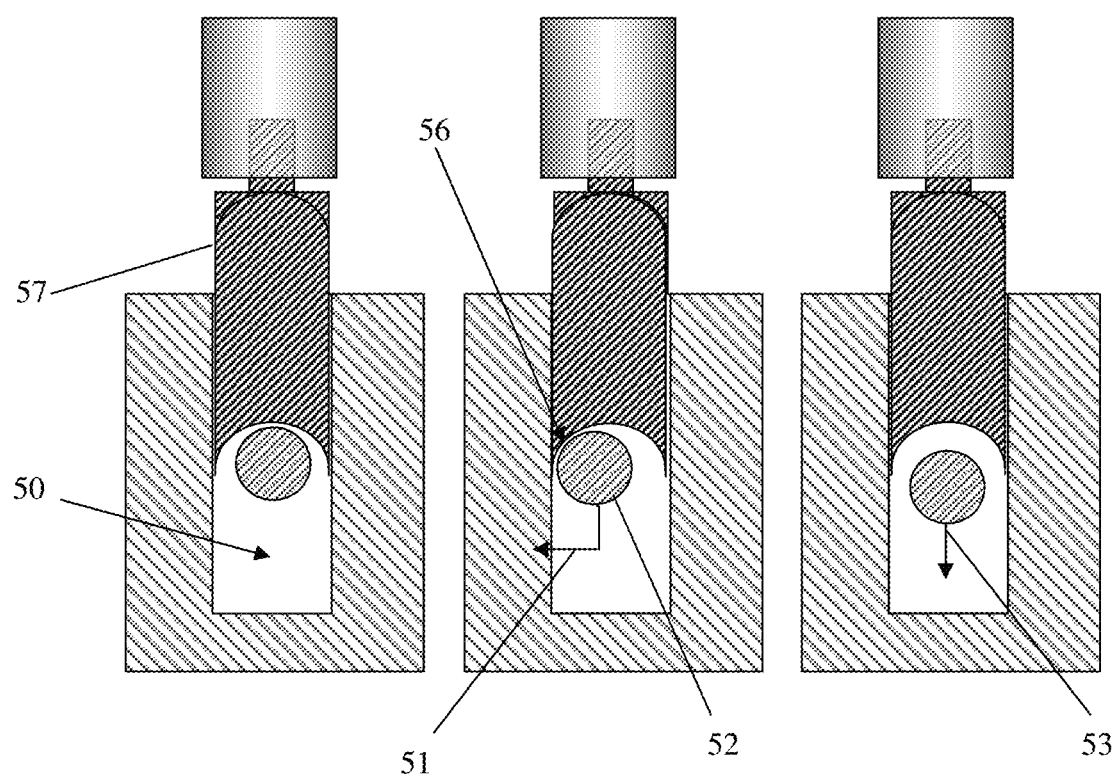
FIG. 5A: Prior art    FIG.5B: Prior art    FIG.5C: Prior art

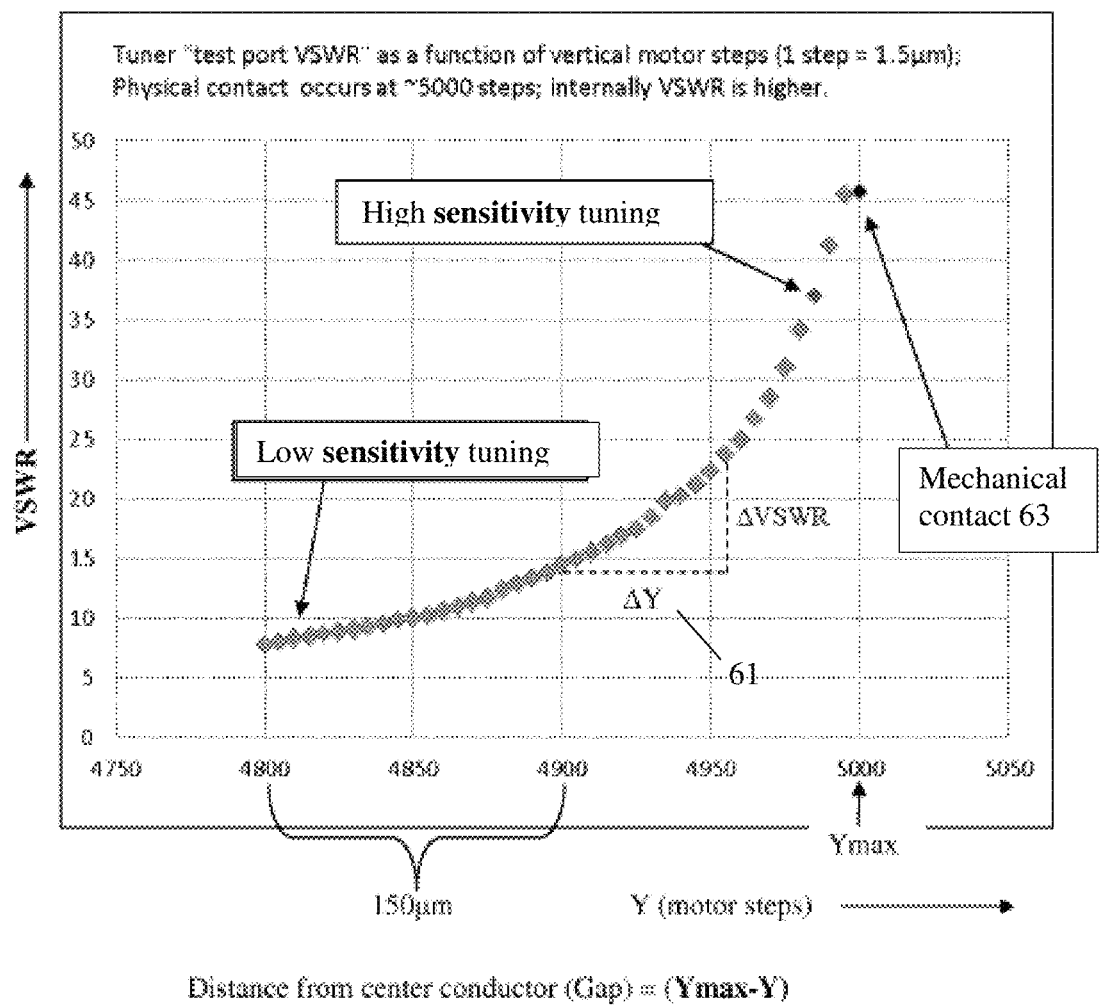
FIG. 6: Prior art

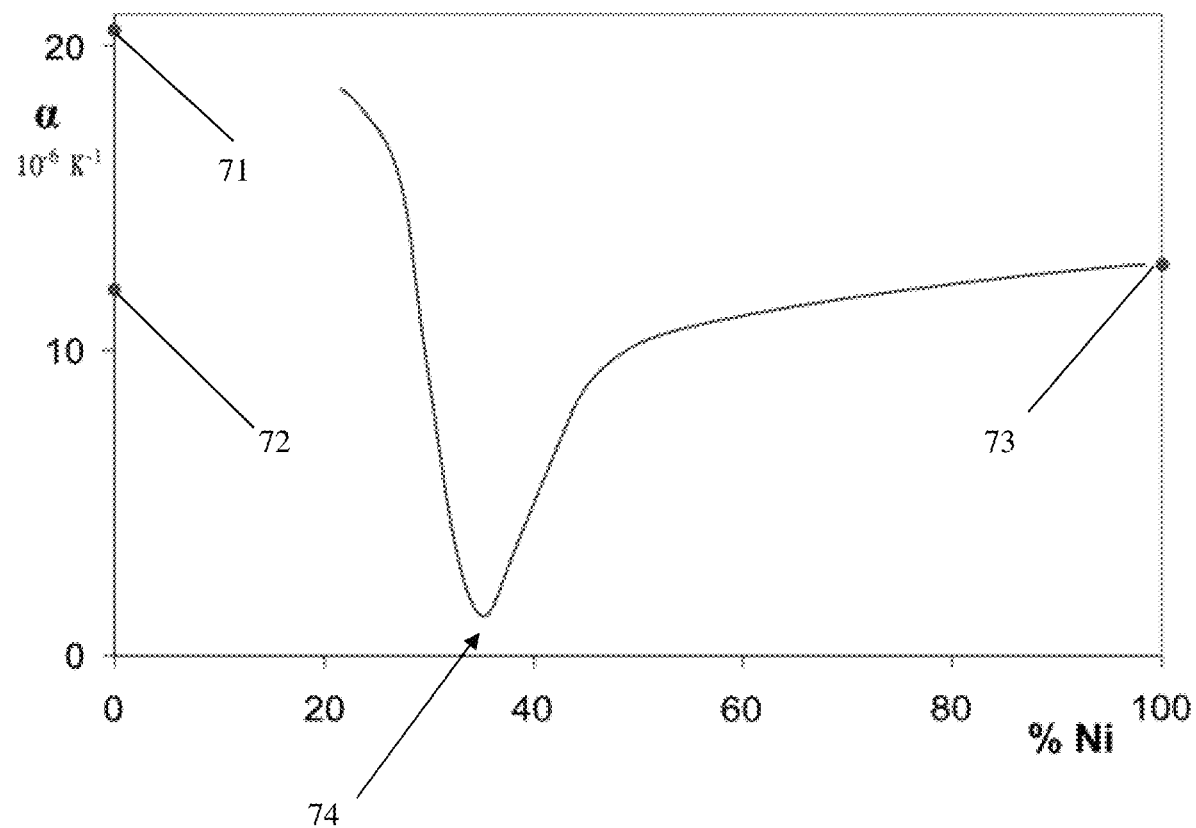
FIG. 7: Prior art

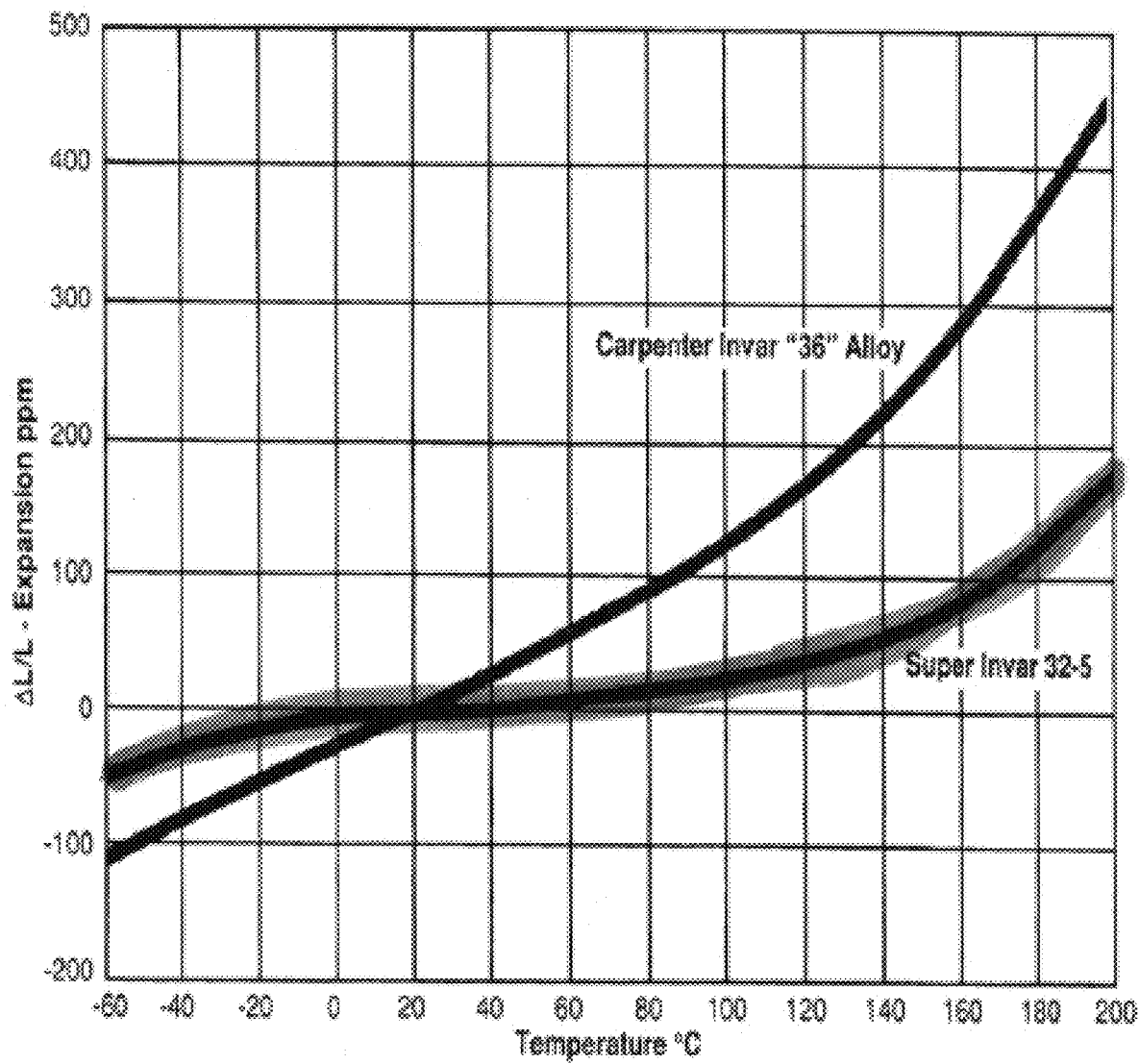
FIG. 8: Prior art

Physical Properties

Specific gravity ........................ 8.15
Density
lb/cu in ............................... 0.294
kg/cu m .............................. 8150
Electrical resistivity (RT)
microhm-cm ............................ 80
Mean coefficient of thermal expansion*
10(-6)/°F(-67 to 203 °F) ............. 0.35
10(-6)/°C(-55 to 95°C) ........... 0.63

FIG. 9A: Prior art

| Element | Typical Analysis |
|---|---|
| Carbon | 0.05 |
| Nickel | 31.75 |
| Iron | Balance |
| Silicon | 0.09 |
| Manganese | 0.39 |
| Cobalt | 5.36 |
| Sulfur | 0.01 |
| Chromium | 0.03 |
| Aluminum | 0.07 |
| Copper | 0.08 |

FIG. 9B: Prior art

| Material | Electrical Conductivity [1/Ωm] |
|---|---|
| Aluminum | $37.7 \cdot 10^6$ |
| Copper | $59.6 \cdot 10^6$ |
| Gold | $45.2 \cdot 10^6$ |
| Iron | $9.9 \cdot 10^6$ |
| Nickel | $14.3 \cdot 10^6$ |
| Silver | $63.0 \cdot 10^6$ |

FIG. 11: Prior art

TRANSMISSION LINE FOR HIGH POWER TUNERS

PRIORITY CLAIM

Not Applicable

CROSS-REFERENCE TO RELATED ARTICLES

1. Load Pull [online], Wikipedia [retrieved on 11-18-2016], Retrieved from Internet <URL:https://en.wikipedia.org/wiki/Load_pull>.
2. "Computer Controlled Microwave Tuner—CCMT" Product Note 41, Focus Microwaves January 1998.
3. Standing wave ratio, VSWR [online], Wikipedia [retrieved 03-02-2017], Retrieved from Internet <URL:http://en.wikipedia.org/wiki/Standing_wave_ratio>.
4. Tsironis, U.S. Pat. No. 6,674,293, "Adaptable pre-matched tuner system and method".
5. Invar [online], Wikipedia [retrieved 01-11-2019]. Retrieved from Internet URL <http://en.wikipedia.org/wiki/Invar>.
6. Super INVAR 32-5 Technical Data [online], High Temp Metals [retrieved on 12-15-2018], Retrieved from Internet URL <http://www.hightempmetals.com/techdata/hitempSuperInvardata.php>.
7. Electrical Conductivity of common Materials [online], The Engineering ToolBox [retrieved on 12-17-2018], Retrieved from Internet URL<https://www.engineeringtoolbox.com/conductors-d_1381.html>.
8. Scattering (s-) parameters [online], Wikipedia [retrieved on 12-18-2018], Retrieved from Internet URL <https://en.wikipedia.org/wiki/Scattering_parameters#Definition>.

BACKGROUND OF THE INVENTION

This invention relates to RF load and source pull testing of medium and high-power RF transistors and amplifiers using remotely controlled electro-mechanical impedance tuners.

Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using only non-linear numeric models.

A popular method for testing and characterizing such microwave components (transistors) in the non-linear region of operation is "load pull" (FIG. 1). Load pull is a measurement technique employing microwave impedance tuners (2, 4) and other microwave test equipment, such as signal sources (1), test fixtures (3) allowing efficient DC and RF access to the DUT (12) and power meters (5), bias networks (tees) (10) and (11), the whole controlled by a computer (6), which communicates and controls the tuners (2, 4) and the other equipment (1, 5) using digital cables (7, 8, 9). The tuners are to manipulate the microwave impedances presented to the Device Under Test DUT (12) (see ref. 1); tuners allow determining the optimum impedance conditions for designing amplifiers and other microwave components for specific performance targets, such as maximum gain, efficiency, inter-modulation etc.; this document refers hence to "tuners" as being "impedance tuners", in order to distinct from "tuned receivers (radios)", popularly called elsewhere also "tuners" because of the included tuning circuits (see ref. 2).

Impedance tuners, see FIG. 2, comprise a low loss transmission airline (24), typically a parallel-plate airline (slabline) (34) having, usually, characteristic impedance Zo=50 Ohm, a straight center conductor (23), anchored (29) freestanding suspended between the coaxial connectors of the test (25) and idle (26) ports to minimize transmission loss; and one or more adjustable tuning probes (22); the probes (22) are attached to precision vertical axes (21) which are mounted in mobile carriages (28); stepper motors (201, 202) control the axes (21), which move the probes (22) vertically (216) towards to or away from the center conductor (23); and the carriages (28), employing horizontal mechanisms, such as belts, rack-and-pinion or ACME rods (27), which control the horizontal (217) movement of the probes (22) parallel to the center conductor (23). The vertical movement (216) controls the amplitude and the horizontal movement (217) controls the phase of the reflection factor presented at the tuner test port (25). This way the whole reflection factor area (Smith chart) is covered, allowing for a quasi-infinity of impedances from Zmin to Zmax to be synthesized at any given frequency, within the "tuning range" of the tuner. Typical values of state-of-the-art tuners are $|Zmin|\approx 2$ Ohm and $|Zmax|\approx 1250$ Ohm; this corresponds to Voltage Standing Wave Ratio (VSWR) of approximately 25:1 or $|GAMMA|\approx 0.92$). The relation between reflection factor GAMMA and impedance Z is given by $$GAMMA=|GAMMA|*exp(j\Phi)=(Z-Zo)/(Z+Zo) \quad \{eq. 1\},$$

wherein Z is the complex impedance Z=R+jX and Zo is the characteristic impedance. A typical value used for Zo is Zo=50 Ohm (see ref. 3). The equivalent is the Voltage Standing Wave Ratio:

$$VSWR=(1+|GAMMA|)/(1-|GAMMA|) \quad \{eq. 2\}.$$

Metallic tuning probes (22) or "slugs" are made in a cubical form (31), see FIG. 3, with a concave bottom, which allows capturing, when approaching the center conductor (33) (see FIG. 11 in ref. 4) the electric field, which is concentrated in the area between the center conductor and the grounded walls (34) of the slabline. This "field capturing" allows creating high and controllable reflection factors. The critical part is the required close proximity of the probe to the center conductor and the accuracy of both the vertical (36) and horizontal (35) probe movements, whereby small changes ΔY in the vertical probe position (61), FIG. 6, of a few micrometers affects the VSWR by a large amount (Δ-VSWR), especially when the probe approaches mechanical contact (63).

When RF and DC dissipated power is injected into the tuner, some of it is absorbed by the center conductor of the slabline (44). This leads to a rise of its temperature and associated linear expansion (45, 48 in FIG. 4). Since the center conductor (46) has only limited range for expansion, because it is anchored on the port connectors, this will lead to "bending" (47), all this while the tuning probe (41) is in close proximity with the center conductor (46), to generate a high reflection (43); "bending" of the center conductor happens in different ways, depending on the pre-disposition and anchoring on the coaxial connectors at the test or idle slabline ports and since the center conductor cannot be "perfectly" straight (FIG. 5A to 5C). Whereas in an ideal situation (FIG. 5A) the center conductor (52) is positioned exactly in the center of the slabline channel (50), when heated it will bend (or "buckle") and deflect either sidewise

(51) or downwards (53); of course it may also deflect upwards (not shown); in both cases (deflection sideways or upwards) we will have contact (56) with the tuning probe (57). In either case the effect is at best loss of accuracy (53) or at worst an electrical short (51, 56) and damage of the tuner and/or the DUT.

In case a short (56) happens with either temporary or permanent damage of the tuner or the DUT, at least the operator will be alerted and can take measures to correct the situation; but if it does not come to a short (53, case FIG. 5C), then the effect will be loss of calibration data and false measurement. This is because (as shown in FIG. 6) a relatively small movement of the center conductor will change the distance between center conductor and tuning probe and falsify the calibrated VSWR; in other words, the data retrieved from the measurement instruments (FIG. 1) will be recorded at the wrong VSWR values. There will be no warning, just wrong data; it comes even worse: would the operator have doubts about the tuner accuracy, and would he disconnect the tuner from the test setup in order to re-calibrate or verify the calibration on a vector network analyzer (VNA), he, probably, would find that the tuner is accurate. This is because, during the dismantling of the setup the center conductor will cool down and recover its initial (calibrated) position (transition from states FIG. 5C to FIG. 5A); this can be a very critical systemic problem for high power testing using such tuners.

This invention discloses an appropriate structure allowing avoidance of such catastrophic hazard and systemic operation and test problems.

BRIEF DESCRIPTION OF THE SEVERAL VIEWS OF THE DRAWINGS

The invention and its mode of operation will be more clearly understood from the following detailed description when read with the appended drawings in which:

FIGS. 5A through 5C depict prior art: possible center conductor deflections due to thermal expansion: FIG. 5A depicts original position (unheated center conductor); FIG. 5B depicts sidewise deflection (and possible electrical short); FIG. 5C depicts downward deflection changing |Γ| and creating measurement error.

FIG. 6 depicts prior art: the measured dependence of tuner VSWR as a function of distance between tuning probe and center conductor.

FIG. 7 depicts prior art; the thermal expansion coefficient of Nickel/Iron (NiFe) alloys as a function of Nickel content.

FIG. 8 depicts prior art, thermal expansion coefficient of "Super Invar 32-5" versus ordinary or 'Carpenter Invar 36'.

FIGS. 9A through 9B depict prior art: FIG. 9A depicts physical data of Super invar 32-5 for a temperature range.; FIG. 9B depicts composition of Super Invar 32-5.

FIG. 11 depicts prior art: Extracts from a data base for common good electrical conductor metals that can be used, if cost is disregarded, as bulk material for the sidewalls of tuner slablines. Aluminum offers, obviously, the best quality over cost compromise (see ref 7); Aluminum 0.2-1.60$/kg, Copper 4-6$/kg, Silver 473$/kg.

BRIEF DESCRIPTION OF THE INVENTION

Slide screw tuners are designed with three main objectives: (a) generating high GAMMA, (b) having low RF and DC loss and (c) handling high injected and dissipated RF and DC power. This is achieved by (i) using minimal thermal expansion material for the center conductor, (ii) employing high conductivity material for the sidewalls of the tuner airline (slabline) and (iii) Gold or Silver surface plating the center conductor. These measures ensure low RF and DC loss, minimizing the amount of absorbed and dissipated injected RF and traversing DC power and maximizing GAMMA. Thermal expansion of the center conductor leads to false measurements and possible damage of the tuner, whereas high RF loss leads also to reduced tuning range (GAMMA).

DETAILED DESCRIPTION OF THE INVENTION

Figure 1:
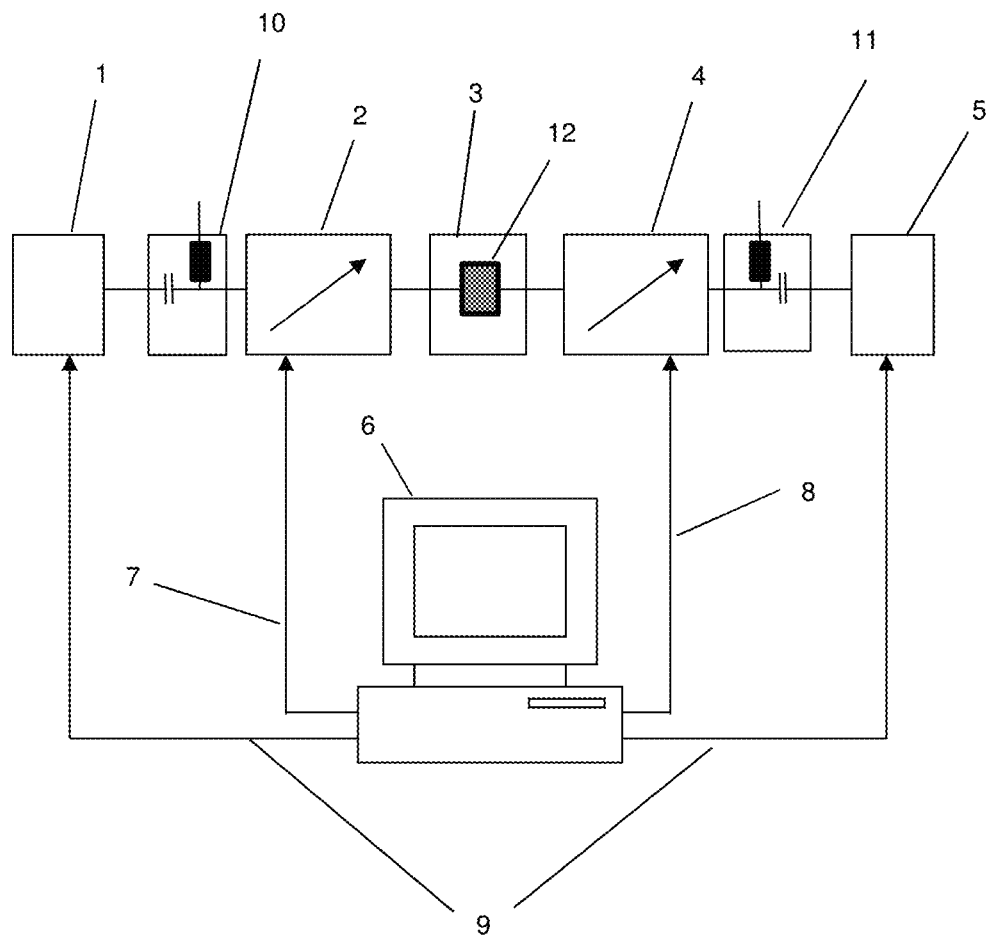
FIG. 1 depicts prior art: a typical automated transistor load pull test system.
Figure 2:
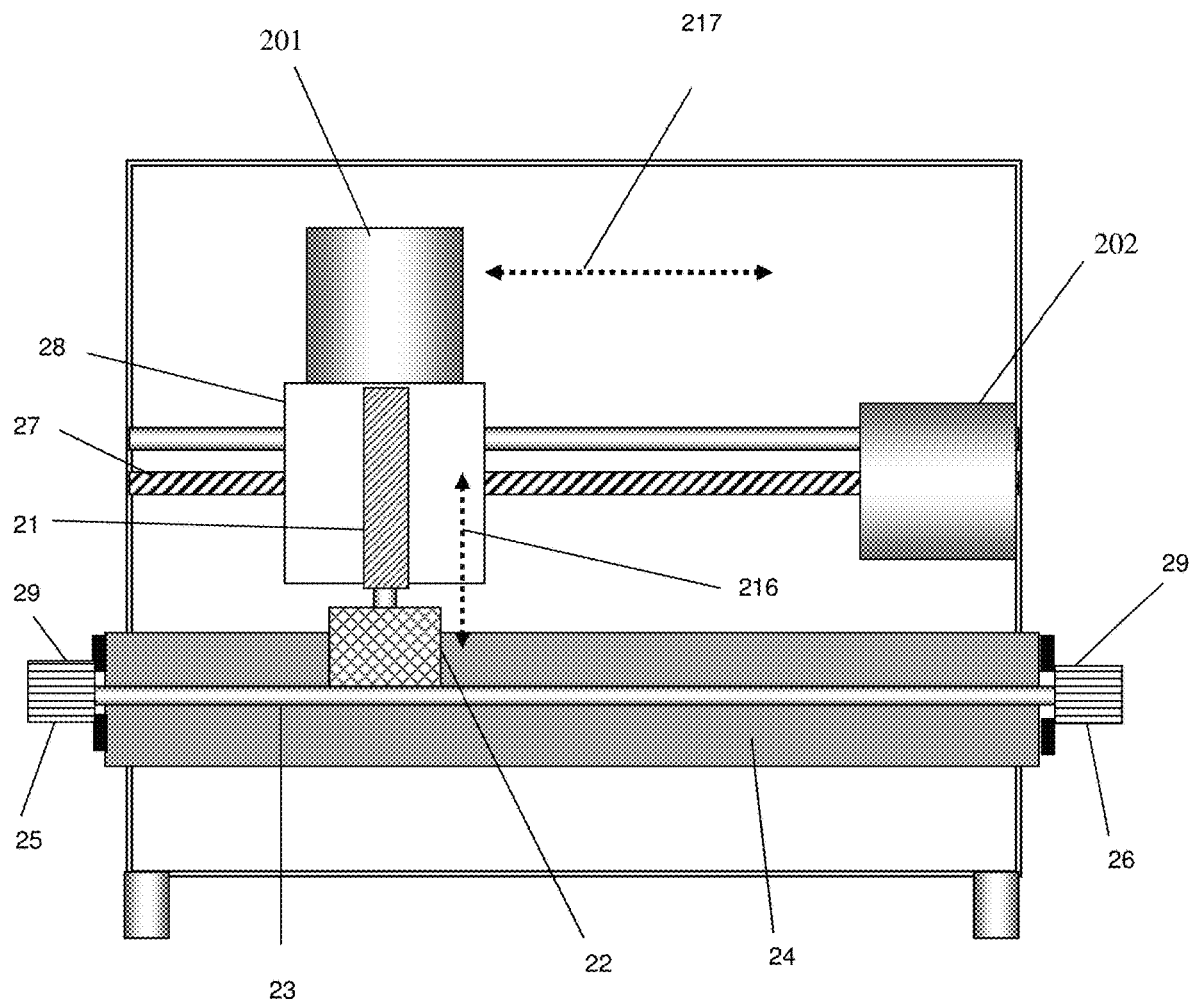
FIG. 2 depicts prior art: a front view of an automated slide screw impedance tuner using a single vertical axis and RF tuning probe (slug).

This invention discloses simple and easily employable techniques destined to allow automated slide screw impedance tuners to have repeatable pre-calibrated impedances, generate high GAMMA and operate without risking destructive behavior and/or systemic measurement errors. The tuner is an RF two-port, best described by its scattering (s-) parameters (see ref. 8) for RF performance, and by the residual DC resistance of the center conductor of its slabline for DC performance. In a typical load pull configuration (FIG. 1) the DUT is DC-biased through the tuner, i.e. the bias tees (10) and (11) are inserted (in signal flow) before the input (2) and after the output (4) tuner. This reduces the insertion loss in the section between tuner and DUT, that would be caused if the DC bias tees were inserted between tuner and DUT; this insertion loss would reduce the tuning range |GAMMA|. The tuner absorbs power, both RF and DC. The dissipated power $P_{DIS}$ is calculated as the sum of dissipated RF power $P_{RF}$ and DC power $P_{DC}$, wherein $P_{RF}=P_{INJ}*|S21|^2/(1-|S11|^2)$ {eq. 3} and the dissipated DC power is $P_{DC}=I_{DC}^2*R_S$ {eq. 4}, wherein $P_{INJ}$ is the injected RF power into the input tuner either by the signal source but, more importantly, into the output tuner by the amplified outgoing power from the DUT; $I_{DC}$ is the DC current through the DUT and $R_S$ is the residual DC resistance of the center conductor of the slabline, including the coaxial connector contact resistances at the test and idle ports of the tuner.

All this dissipated power leads to heating and linear thermal expansion of the thin center conductor of the slabline; to reduce and quasi eliminate this phenomenon the solution is to use the lowest available, but expensive, thermal expansion metal (INVAR—FIG. 7 or SUPER INVAR—FIG. 8) but only for the heated tuner part, i.e. the center conductor of the slabline; the body of the slabline itself, including the sidewalls, can be made using much cheaper and high electrical conductivity material, such as aluminum or any other, not necessarily temperature stable, but low or moderate cost material, like copper, since the body of the slabline is not heated. Using INVAR type of alloy for the entire slabline (center conductor and sidewalls)

is meaningless for two main reasons: (i) Cost (INVAR is expensive) and (ii) Electrical Conductivity (INVAR as a NiFe (Nickel-Iron) alloy and has approximately 4 times higher electrical resistance and loss than Aluminum and 5 to 6 times higher than Copper, FIG. 11).

The reason why all this invention concerns mostly the center conductor of the airline (slabline) of the tuner is because the center conductor is sensitive to self-heating (FIG. 10); this is for two main reasons:

(a) the center conductor is a long thin metallic rod with small mass, and (b) the center conductor is suspended freestanding between the coaxial connectors of the two slabline ports and thermally isolated from the environment, since any physical contact with a heat dissipating metallic radiator would create a short circuit and incapacitate the tuner's RF behavior.

Figure 3:
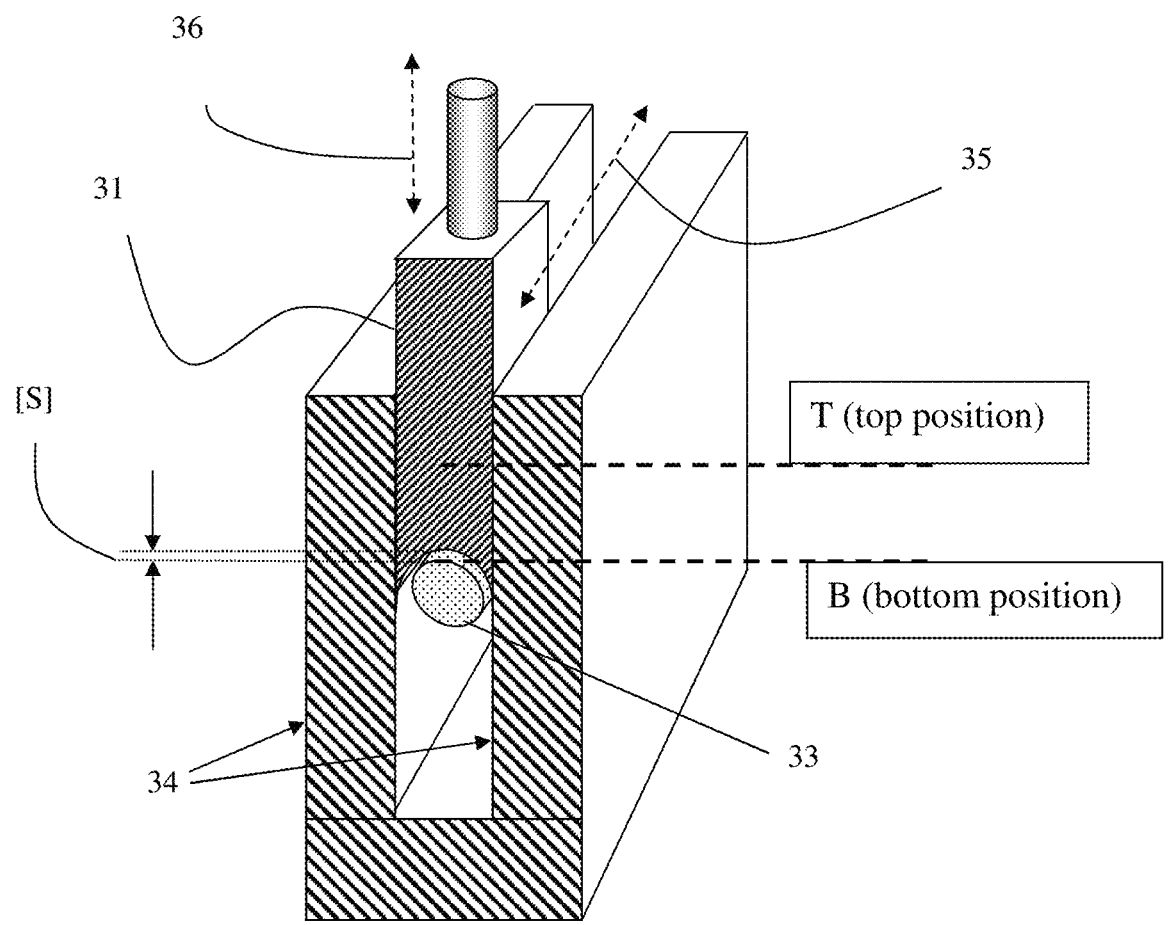
FIG. 3 depicts Prior Art: cross section of tuning probe inside a slotted airline (slabline) approaching the center conductor.
Figure 4:
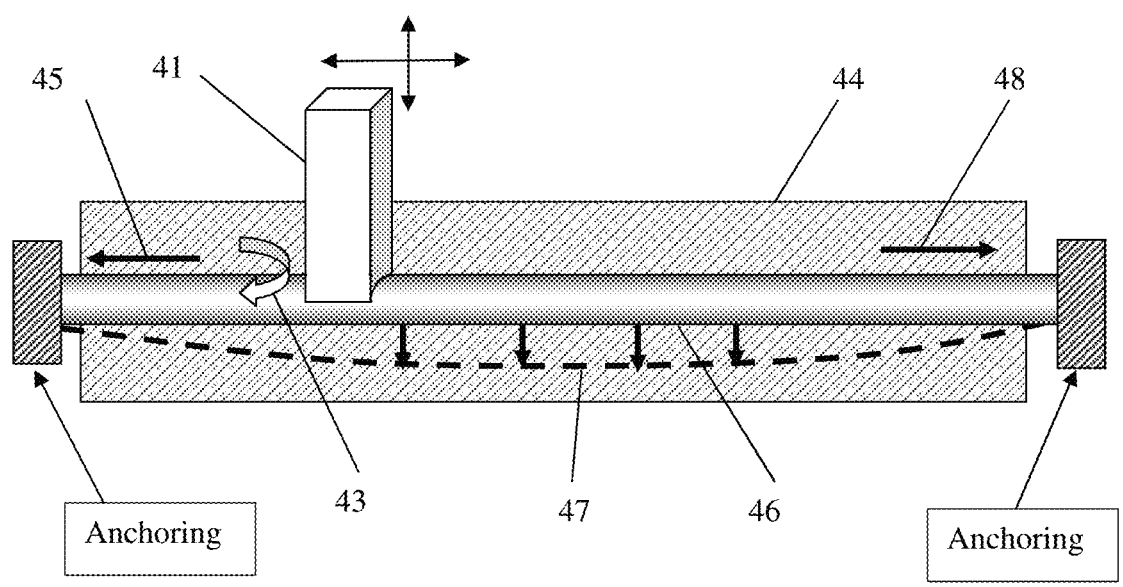
FIG. 4 depicts center conductor deformation due to heating and expansion and associated position of center conductor related to tuning probe.
Figure 10:
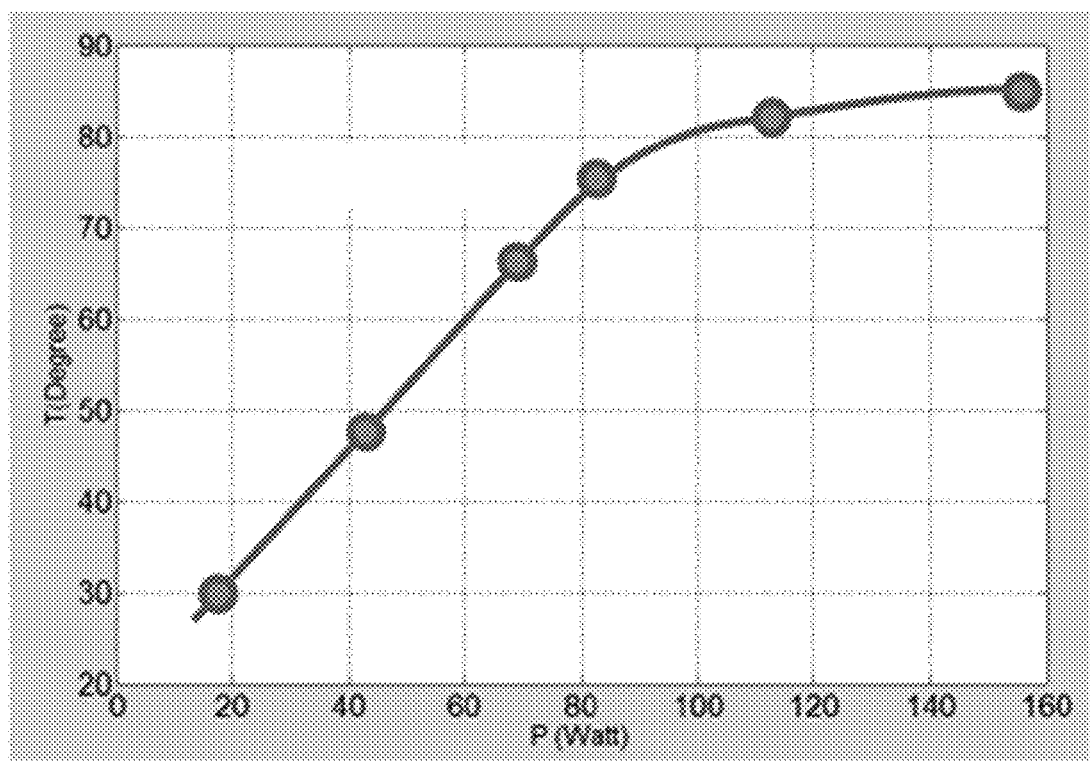
FIG. 10 depicts the temperature of the center conductor of a high-power slide screw tuner, as a function of dissipated power.

The plot of FIG. 10 shows a saturation of the temperature curve above 90 Watt dissipated power, obviously because, above a certain temperature, the center conductor rod radiates heat into the environment. This is facilitated by the fact that the slabline (FIG. 3) is open and allows heat to escape upwards. For this reason, subsequent observations of the thermal expansion coefficient (TEC or $\alpha$) are restricted to temperatures up to 100° C. For the above reason (b) it is obvious that the heating center conductor does not transfer heat to the slabline itself. There is, therefore, no practical advantage and reason to extend the use of expensive low thermal expansion metallic alloy, such as INVAR or SUPER INVAR to the body and sidewalls of the slabline. The additional reason for not using INVAR: INVAR is electrical conductivity: the Iron-Nickel alloy has high electrical resistivity RT (FIG. 9A). Since the sidewalls of the slabline must (i) have very low electrical resistivity, and (ii) be as low cost as allowable, the best choice is Aluminum, followed by Copper and excluding, of course other, technically possible but economically meaningless alternatives, such as Gold or Silver.

The metallic alloys to be used are known as INVAR (see ref. 5 and FIG. 7) or SUPER-INVAR (see ref. 6 and FIGS. 8 and 9). INVAR is a simple Iron-Nickel alloy of which the thermal expansion coefficient, TEC, or $\alpha$[ppm/° C.] varies strongly, depending on Nickel content (FIG. 7). Whereas full Nickel has a TEC of 13 ppm/° C. (72, 73) and pure iron over 20 ppm/° C. (71), an alloy of 36% Nickel and 64% Iron (also called INVAR 36) has a TEC of only 1.2 to 1.3 ppm/° C. (74). The linear thermal expansion of the metallic center conductor can be calculated as $\Delta L = \alpha * L * \Delta T$, {eq. 5}, wherein L is the length of the center conductor rod, and $\Delta T$ the temperature increase above room temperature. An issue appears, though, since $\alpha$ is also temperature dependent (see trace for INVAR 36 in FIG. 8). This observation leads to two basic embodiments of the invention. In a first embodiment, for low to medium power tuners, ordinary INVAR 36 can be used. For high power tuners, in a second embodiment, choosing SUPER INVAR 32-5 (FIG. 8), is the preferred solution.

However, these values are valid at room temperature only; as FIG. 8 shows, normal INVAR (or Carpenter Invar "36") has a strongly temperature dependent TEC varying from −0.50 to over 1.2 ppm/° C. when the center conductor temperature varies from −20° C. to 100° C. Therefore, ordinary INVAR 36 is not the best solution for very high-power tuners. It takes the more sophisticated "SUPER INVAR 32-5" alloy (FIG. 8) to ensure temperature independence and stronger reducing thermal expansion. SUPER INVAR 32-5 is a complex alloy of 10 metals with 31.75% Nickel and approximately 62.5% Iron, having quasi constant TEC between 0.3 and 0.6 ppm/° C. in the same temperature range (FIG. 9). Using INVAR and SUPER INVAR reduces thermal expansion of the center conductor by a factor between 10 and 40, compared with ordinary Steel, which is used today for tuner center conductors. This is enough to avoid damage and measurement inaccuracies at medium to high power.

Iron/Nickel alloys do not have superior electrical conductivity. As can be seen from FIG. 9A the electrical resistivity of SUPER INVAR is 80 $\mu \Omega$-cm whereas Silver, Copper, Gold and Aluminum have 1.6 to 2.7 $\mu \Omega$-cm. The thermally stable center conductor must therefore be silver- or gold-plated to minimize electrical resistance and RF electrical loss. In general Gold is easy to deposit by electrolysis, creates a better passivation and is preferred to Silver for electrical components.

Obvious alternative embodiments to the herein disclosed method of minimizing the thermal expansion of the center conductor of slide screw impedance tuners are imaginable and possible but shall not impede on the validity of the basic idea of the present invention.

What I claim as my invention is:

1. Slotted airline (slabline) for high power slide screw impedance tuner, comprising two sidewalls, a test port and an idle port with coaxial connectors on each port and a cylindrical center conductor anchored on either coaxial connector between the ports,
   wherein
   the center conductor is made of gold-plated lowest thermal expansion alloy SUPER INVAR 32-5.

2. The slotted airline of claim 1, wherein the sidewalls are made of high conductivity Aluminum.

3. The slotted airline of claim 1 having characteristic impedance Zo=50 Ohms.

* * * * *